United States Patent
Miyashita (10) Patent No.: US 6,673,705 B2
(45) Date of Patent: Jan. 6, 2004

(54) METHOD OF MANUFACTURING A MISFET HAVING POST OXIDE FILMS HAVING AT LEAST TWO KINDS OF THICKNESS

(75) Inventor: Katsura Miyashita, Naka-gun (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/197,913

(22) Filed: Jul. 19, 2002

(65) Prior Publication Data

US 2002/0179944 A1 Dec. 5, 2002

Related U.S. Application Data

(62) Division of application No. 09/892,660, filed on Jun. 28, 2001, now abandoned.

(30) Foreign Application Priority Data

Jun. 30, 2001 (JP) ........................................ 2000-200257

(51) Int. Cl.[7] ......................................... H01L 21/3205
(52) U.S. Cl. ..................... 438/585; 438/200; 438/257
(58) Field of Search ................................. 438/585, 200, 438/257–264, 253, 254, 199; 257/296–310

(56) References Cited

U.S. PATENT DOCUMENTS

| 5,946,548 A | * | 8/1999 | Hashimoto et al. ........... 438/41 |
| 5,963,803 A | | 10/1999 | Dawson et al. |
| 5,976,934 A | * | 11/1999 | Hayakawa .................. 438/258 |
| 6,025,253 A | | 2/2000 | Sun |
| 6,200,868 B1 | * | 3/2001 | Mase et al. .................. 438/301 |

FOREIGN PATENT DOCUMENTS

| JP | 8-107157 | | 4/1996 | |
| JP | 8-306797 | | 11/1996 | |
| JP | 2001-15748 | | 1/2001 | |
| JP | 200115748 | * | 1/2001 | ........... H01L/29/78 |

* cited by examiner

*Primary Examiner*—Carl Whitehead, Jr.
*Assistant Examiner*—Yennhu B Huynh
(74) *Attorney, Agent, or Firm*—Foley & Lardner

(57) ABSTRACT

Disclosed is a semiconductor device in which first and second MISFETs are formed, each of the first and second MISFETs including a source region, a drain region, a gate insulating film, a gate electrode and a covering insulating film. The source region and the drain regions are formed apart from each other within a semiconductor substrate. The gate insulating film is formed on the surface of the semiconductor substrate and positioned between the source region and the drain region, and the gate electrode is formed on the gate insulating film. The covering insulating film is formed to cover the side surface of the gate electrode, the gate insulating film and a part of the source region or the drain region. The first and second MISFETs differ from each other in the thickness of a first region of the covering insulating film positioned to cover the source region or the drain region.

12 Claims, 8 Drawing Sheets

METHOD OF MANUFACTURING A MISFET HAVING POST OXIDE FILMS HAVING AT LEAST TWO KINDS OF THICKNESS

This application is a divisional of application Ser. No. 09/892,660 filed on Jun. 28, 2001 now ABN the entire contents of which are incorporated herein by reference.

CROSS-REFERENCE TO RELATED APPLICATIONS

This application is based upon and claims the benefit of priority from the prior Japanese Patent Application No. 2000-200257, filed Jun. 30, 2000, the entire contents of which are incorporated herein by reference.

BACKGROUND OF THE INVENTION

The present invention relates to a semiconductor device including MISFET (Metal Insulator Semiconductor Field Effect Transistor) having a plurality of post-oxide films differing from each other in thickness, which are formed in the same chip used in a large scale integrated circuit (LSI) and a method of manufacturing the same.

In an SOC (System On a Chip) or a system LSI, various MOSFETs (Metal Oxide Semiconductor Field Effect Transistor) are formed in a chip. A relatively high power source voltage, e.g., 3.3V, 2.5V, 1.8V, is required in an input-output circuit, a mixed DRAM circuit or a mixed analog circuit. On the other hand, a MOSFET having a long gate and a relatively thin gate insulating film and driven by a relatively low power voltage, e.g., 1.5V, 1.2V, 1.0V, is used in a logic (digital) circuit or a mixed SRAM circuit in order to minimize the MOSFET delay.

Also, MOSFETs having different characteristics, i.e., a MOSFET for gate load driving and another MOSFET for wiring load driving, are formed as MOSFETs driven by same power source voltage, which are included in the same logic (digital) circuit. The MOSFET for gate load driving is required to include a MOSFET section having a low load capacitance in order to drive multi-stage CMOS transistors. Also, MOSFETs for wiring load driving are required to have a high drain current for driving the multi-wiring layer.

Concerning the circuit requiring a high power source voltage, the gate insulating film is allowed to have a plurality of regions differing from each other in thickness in order to cope with the situation described above. However, if the gate insulating film is allowed to have a plurality of regions differing from each other in thickness, problems are generated as follows. Specifically, where a post-oxide film adapted for the low voltage MOSFET and the conditions of the source-drain extension are used in the high voltage system, problems tend to be generated in the drain breakdown voltage, the hot carrier breakdown voltage, the GIDL (Gate Induced Drain Leakage Current) and the PN tunneling current.

If the drain design is made the same, the following problems are generated concerning the circuit driven with a low power source voltage. Specifically, in a MOSFET for gate load driving, it is desirable for the parasitic capacitance such as the mirror capacitance and the junction capacitance to be minimized. On the other hand, in a MOSFET for wiring load driving, it is desirable to increase the drain current even if the extension is formed deep, so as to increase the mirror capacitance. It follows that a MOSFET for gate load driving and a MOSFET for wiring load driving are considered to be different from each other in the optimum conditions for the post-oxide film and the source-drain extension.

As described above, in the conventional semiconductor device, it was difficult to form a single integrated circuit under a single condition.

BRIEF SUMMARY OF THE INVENTION

An object of the present invention, which has been achieved for solving the above-noted problems inherent in the prior art, is to provide a semiconductor device having an optimum MISFET structure in a single integrated circuit which can cope with varying operating conditions and to provide a method of manufacturing the particular semiconductor device.

According to a first aspect of the present invention, there is provided a semiconductor device including first and second MISFETs, each of the first and second MISFETs comprising a semiconductor substrate common to the first and second MISFETs; a source region formed in the semiconductor substrate; a drain region formed in the semiconductor substrate apart from the source region; a gate insulating film provided on the surface of the semiconductor substrate and positioned between the source region and the drain region; a gate electrode provided on the gate insulating film; and a covering insulating film having a first region arranged on the source region and the drain region and a second region arranged on the side surfaces of the gate electrode and the gate insulating film, the first region in the first MISFET differing in thickness from the first region in the second MISFET.

According to a second aspect of the present invention, there is provided a semiconductor device including first and second MISFETs, each of the first and second MISFETs comprising: a semiconductor substrate common to the first and second MISFETs; a source region formed in the semiconductor substrate; a drain region formed in the semiconductor substrate apart from the source region; a gate insulating film provided on the surface of the semiconductor substrate and positioned between the source region and the drain region; a gate electrode provided on the gate insulating film; and a covering insulating film having a first region arranged on the source region and the drain region and a second region arranged on the side surfaces of the gate electrode and the gate insulating film, the first and second region in the first MISFET differing in thickness from the first and second region in the second MISFET.

According to a third aspect of the present invention, there is provided a method of manufacturing a semiconductor device including first and second MISFETs comprising the steps of: providing gate insulating films of the first and second MISFETs on a semiconductor substrate; providing gate electrodes on the gate insulating films; covering the gate electrodes of the first and second MISFETs with an insulating material film, the material film providing the basis of a covering insulating film having a first region arranged on the semiconductor substrate and a second region arranged on the side surfaces of the gate electrode and the gate insulating film in the first and second MISFETs; decreasing the thickness of the insulating material film by etching in a region corresponding to the first region of the covering insulating film in the first MISFET; and forming after the etching step a source region and a drain region in the surface region of the semiconductor substrate by ion implantation through the first region of the covering insulating film with the gate electrode used as a mask in the first and second MISFETs.

According to a fourth aspect of the present invention, there is provided a method of manufacturing a semiconductor device including first and second MISFETs comprising the steps of: providing gate insulating films of the first and second MISFETs on a semiconductor substrate; providing gate electrodes on the gate insulating films; covering the gate electrode of the first and second MISFETs with a first insulating material film, the first insulating material film providing the basis of a covering insulating film having a first region arranged on the semiconductor substrate and a second region arranged on the side surfaces of the gate electrode and the gate insulating film in the second MISFET; removing the first insulating material film from the first MISFET; covering, after removal of the first insulating film, the gate electrode of the first MISFET with a second insulating material film, the second insulating material film providing the basis of a covering insulating film having a first region arranged on the semiconductor substrate and a second region arranged on the side surfaces of the gate electrode and the gate insulating film in the first MISFET; and forming after the gate electrode of the first MISFET is covered with the second insulating material film, a source region and a drain region in the surface region of the semiconductor substrate by ion implantation through the first region of the covering insulating film with the gate electrode used as a mask in the first and second MISFETs.

According to a fifth aspect of the present invention, there is provided a method of manufacturing a semiconductor device including first and second MISFETs comprising the steps of: providing gate insulating films of the first and second MISFETs on a semiconductor substrate; providing gate electrodes on the gate insulating films; implanting ions selected from the group consisting of ions that permit changing the oxidizing rate, ions that permit changing the nitriding rate and ions that permit changing the oxynitriding rate into regions in which the first MISFET is to be formed; covering the gate electrodes of the first and second MISFETs with an insulating material film, the insulating material film providing the basis of a covering insulating film having a first region arranged on the semiconductor substrate and a second region arranged on the side surfaces of the gate electrode and the gate insulating film in the first and second MISFETs; and forming, after the gate electrodes of the first and second MISFETs are covered with the insulating material film, a source region and a drain region in the surface region of the semiconductor substrate by ion implantation through the first region of the covering insulating film with the gate electrode used as a mask in the first and second MISFETs; wherein, in the case of implanting ions that permit changing the oxidizing rate, the covering insulating film is a semiconductor oxide film; in the case of implanting ions that permit changing the nitriding rate, the covering insulating film is a semiconductor nitride film; and in the case of implanting ions that permit changing the oxynitriding rate, the covering insulating film is a semiconductor oxynitride film.

Further, according to a sixth aspect of the present invention, there is provided a method of manufacturing a semiconductor device including first and second MISFETs comprising the steps of: providing gate insulating films of the first and second MISFETs on a semiconductor substrate; providing an electrode material film providing the basis of a gate electrode on the gate insulating films; etching the electrode material film in the first MISFET so as to form the gate electrode; covering, after the etching step, the gate electrode in the first MISFET and the electrode material film in the second MISFET with a first insulating material film, the first insulating material film providing the basis of a covering insulating film having a first region arranged on the semiconductor substrate and a second region arranged on the side surfaces of the gate electrode and the gate insulating film in the first MISFET; etching the first insulating film and the electrode material film in the second MISFET so as to form the gate electrode; removing the first insulating material film in the second MISFET after the etching step; covering the gate electrode with a second insulating material film in the second MISFET after removal of the first insulating material film, the second insulating material film providing the basis of a covering insulating film having a first region arranged on the semiconductor substrate and second region arranged on the side surfaces of the gate electrode and the gate insulating film in the second MISFET; and forming, after the gate electrode of the second MISFET is covered with the second insulating material film, a source region and a drain region in the surface region of the semiconductor substrate by ion implantation through the first region of the covering insulating film with the gate electrode used as a mask in the first and second MISFETs.

The semiconductor device of the present invention comprises MISFETs including insulating films formed to cover the side surface of the gate electrode and a part of the source region or the drain region, the insulating film included in a first MISFET differing in thickness from the insulating film included in a second MISFET. Therefore, it is possible to provide a semiconductor device having optimum MISFETs conforming with the differences in the power source voltage and in the use of the MISFET. To be more specific, a MISFET including an insulating film having a large thickness is used for forming, for example, an input-output circuit, a mixed DRAM circuit and a mixed analog circuit, which are operated under a high voltage. On the other hand, a MISFET including an insulating film having a small thickness is used for forming, for example, a logic circuit or a mixed SRAM circuit which are operated under a low voltage. The particular construction of the present invention makes it possible to obtain a desired drain current in the MISFET of a low voltage system and permit the MISFET of the high voltage system to be excellent in resistance to the hot carriers so as to suppress the problem of GIDL.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings. Throughout the drawings, the constituents of the semiconductor device having substantially the same function and construction are denoted by the same reference numerals so as to avoid an overlapping description.

Figure 1:
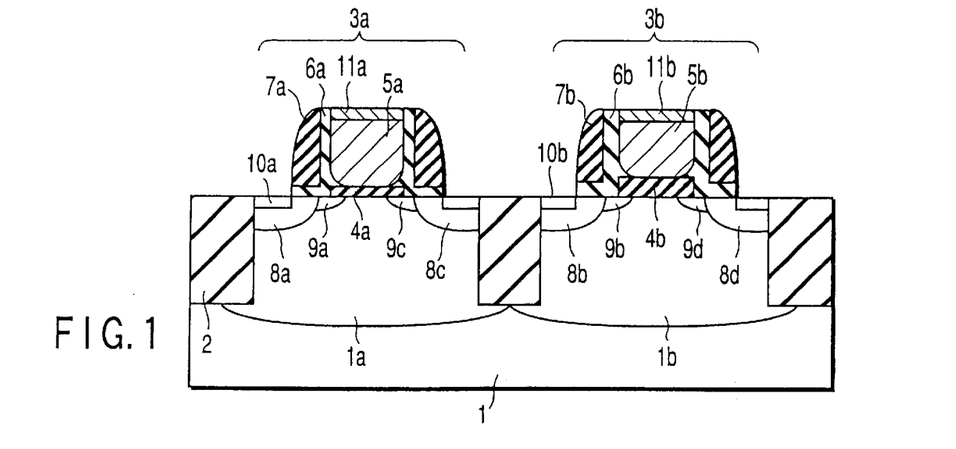
FIG. 1 is a vertical cross-sectional view showing the entire construction of a semiconductor device according to a first embodiment of the present invention.

First Embodiment:

FIG. 1 is a cross-sectional view showing the entire construction of a semiconductor device according to a first embodiment of the present invention. As shown in the drawing, the semiconductor device comprises a p-type silicon substrate 1. A well 1a formed by diffusing a p-type impurity and a well 1b formed by diffusing an n-type impurity are alternately formed in the element forming region. These wells 1a and 1b are formed to partially overlap with each other, and an element isolating insulating film 2 is formed in the overlapping portion to a predetermined depth from the surface of the silicon substrate 1. Different kinds of MOSFETs 3a and 3b are formed in the region other than the element isolating insulating film 2 of the silicon substrate 1.

A gate insulating film 4a having a thickness of, for example, 0.5 to 5 nm and consisting of, for example, an $SiO_2$ film is formed between adjacent element isolating insulating films 2 and a gate electrode 5a made of, for example, polycrystalline silicon (polysilicon) is formed on the gate insulating film 4a so as to selectively form the MOSFET 3a. Also, a side wall insulating film 7a is formed on the side wall of the gate electrode 5a with a post-oxide film 6a such as an $SiO_2$ film interposed therebetween. The post-oxide film 6a is formed thin in a thickness of, for example, 0.5 to 5 nm in a manner to cover not only the side wall of the gate electrode 5a but also the region extending from the side wall of the gate electrode 5a to reach the surface of the silicon substrate 1 in the side portion of the gate electrode 5a.

High concentration diffusion layers 8a and 8c are formed in those portions of the silicon substrate 1 in which the gate electrode 5a and the side wall insulating film 7a are not formed. These high concentration diffusion layers 8a and 8c are formed at a predetermined depth from the surface of the silicon substrate 1 in a manner to have the region directly under the gate electrode 5a sandwiched therebetween. Also, these high concentration diffusion layers 8a and 8c are formed to extend from the regions directly under the side wall insulating films 7a to reach the element isolating insulating films 2. Further, low concentration diffusion layers 9a, 9c are formed at a predetermined depth from the surface of the silicon substrate 1 directly under the side wall insulating films 7a such that these low concentration diffusion layers 9a, 9c are located in the region sandwiched between the high concentration diffusion layers 8a and 8c. These low concentration diffusion layers 9a, 9c are formed shallower than the high concentration diffusion layers 8a, 8c.

Silicide films 10a are formed contiguous to the diffusion layers 8a, 8c in those portions on the surface region of the silicon substrate 1 in which the gate electrode 5a and the side wall insulating films 7a are not formed. These silicide films 10a are formed to extend from the edges of the side wall insulating films 7a to reach the element isolating insulating films 2.

A silicide film 11a is formed in a thickness of 10 to 60 nm on the upper surface of the gate electrode 5a.

MOSFET 3b is basically equivalent in construction to MOSFET 3a, except that MOSFET 3b includes a thicker gate insulating film 4b and a thicker post-oxide film 6b. To be more specific, the gate insulating film 4b is formed to a thickness of, for example, 3 to 10 nm, which is thicker than the gate insulating film 4a of MOSFET 3a. Also, the post-oxide film 6b is formed to a thickness of, for example, 3 to 15 nm, which is thicker than the post-oxide film 6a included in the MOSFET 3a.

The method of manufacturing the semiconductor device shown in FIG. 1 will now be described with reference to the cross-sectional views shown in FIGS. 2A to 4B.

Figure 2A:
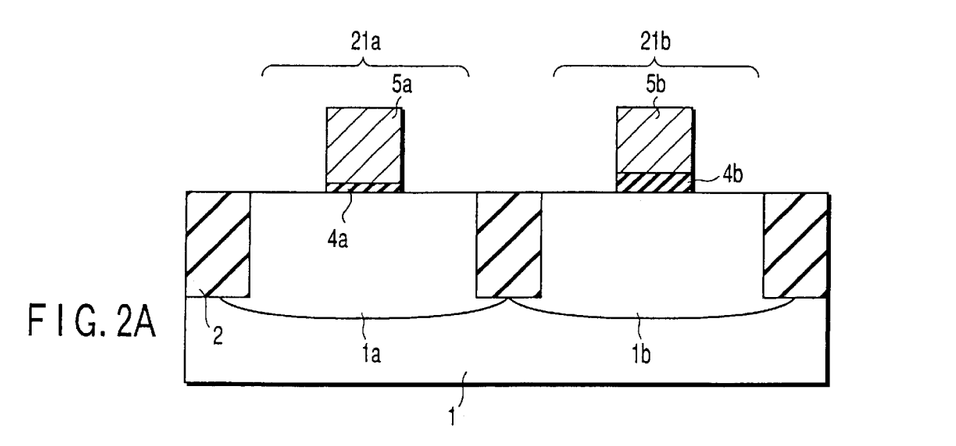
FIGS. 2A and 2B are cross-sectional views collectively showing the initial manufacturing steps of the semiconductor device according to the first embodiment of the present invention.

In the first step, a plurality of trenches are formed to a predetermined depth from the surface of the silicon substrate 1, followed by laying an insulating film in these trenches so as to form a plurality of element isolating insulating films 2, thereby defining element forming regions 21a and 21b, as shown in FIG. 2A. Then, a p-type impurity such as boron is diffused in the element forming region 21a by, for example, an ion implantation method so as to form the p-type well 1a. On the other hand, the n-type well 1b is formed in the element forming region 21b by the ion implantation of, for example, phosphorus an equivalent method of forming region 21a.

After formation of the p-type well 1a and the n-type well 1b, laminate structures consisting of gate insulating films 4a, 4b and gate electrodes 5a, 5b are selectively formed within the element forming regions 21a and 21b, respectively on the surface of the silicon substrate 1. It should be noted that gate insulating films 4a and 4b are formed under different conditions so as to make the gate insulating film 4a thinner than the gate insulating film 4b.

Figure 2B:
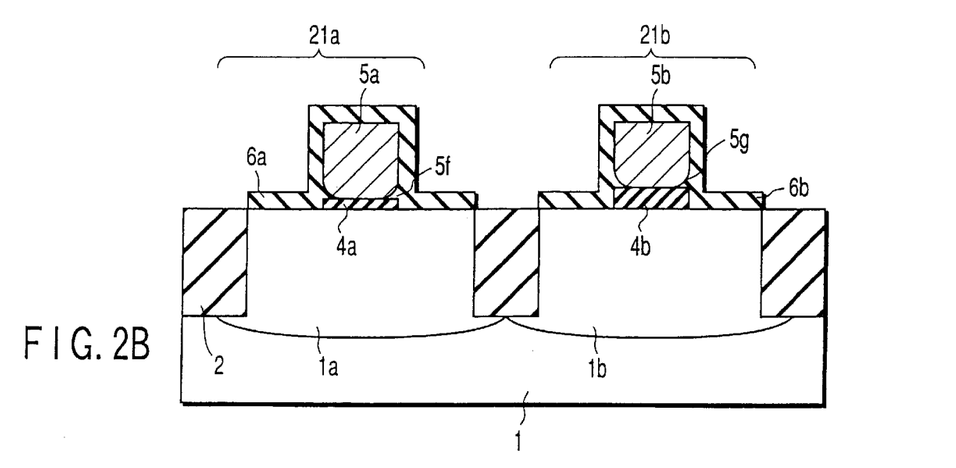

In the next step, the post-oxide film 6a is formed on the surface of the element forming region 21a, and the post-oxide film 6b is formed on the surface of the element forming region 21b, as shown in FIG. 2B. The post-oxide film 6a is formed thin in a manner to cover the upper surface and side surface of the gate electrode 5a, the exposed portion of the gate insulating film 4a and the surface of the silicon substrate 1 within the element forming region 21a and extends to reach the element isolating insulating film 2. The post-oxide film 6b is formed in an equivalent manner to the post-oxide film 6a. It should be noted that the gate electrode 5a is oxidized in the side surface in contact with the gate insulating film 4a and also in contact with the post-oxide film 6a, i.e., a gate side wall bottom portion 5f, so as to be converted into an oxide film in the oxidizing process of the post-oxide film 6a. As a result, the distance between the gate electrode 5a and the diffusion layers 8a, 8c, 9a, 9c, which are formed in subsequent steps, is increased. It follows that it is possible to suppress the electric field concentration in the corner portion of the gate electrode 5a. Similarly, a gate side wall bottom portion 5g substantially equal in shape to the gate side wall bottom portion 5f of the gate electrode 5a is formed in the gate electrode 5b, too.

Figure 3A:
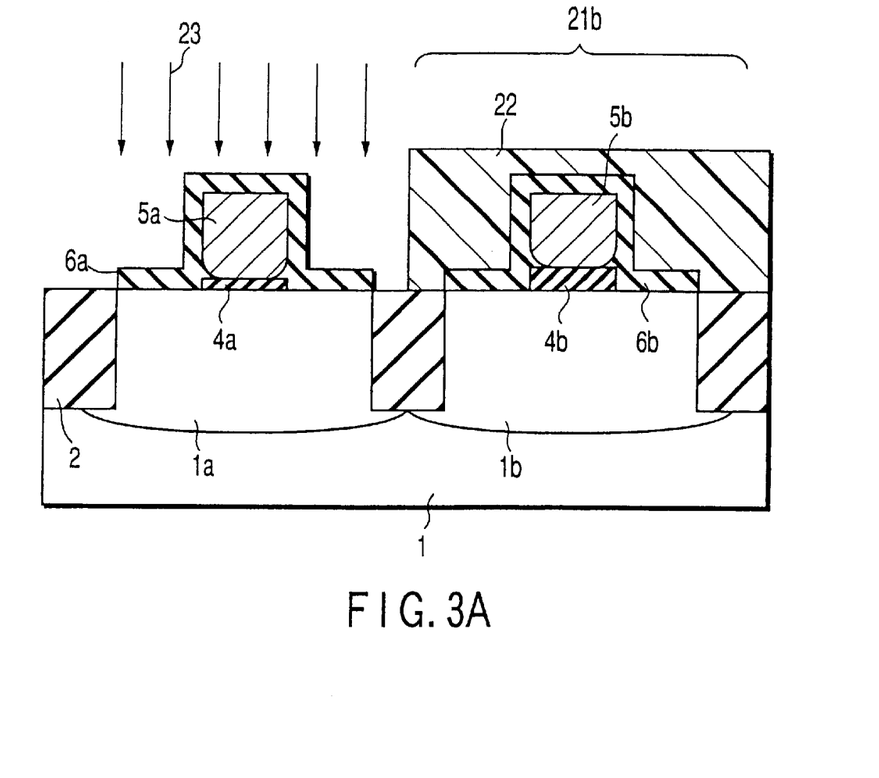
FIGS. 3A and 3B are cross-sectional views collectively showing the steps following the manufacturing step shown in FIG. 2B.
Figure 3B:
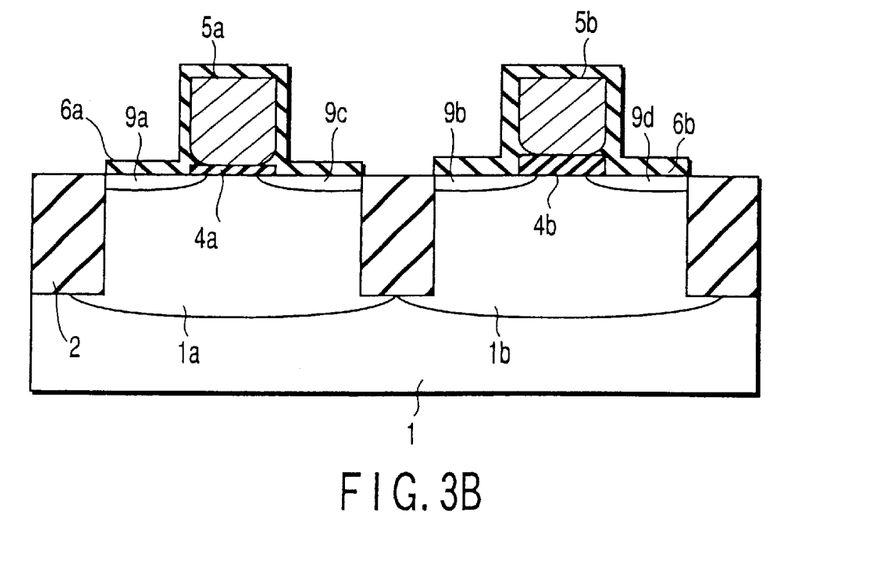

In the next step, a resist 22 is deposited on the entire surface of the semiconductor device, followed by selectively removing the resist 22 positioned on the element forming region 21a by photolithography process such that the resist 22 is left unremoved on the element forming region 21b alone, as shown in FIG. 3A. Then, a wet etching 23 is applied by using, for example, dilute hydrofluoric acid with the remaining resist 22 used as a mask. The wet etching is a half etching in which the etching is stopped when the thickness of the post-oxide film 6a is decreased to 0.5 nm to 5 nm. As a result, the thickness of the post-oxide film 6a is isotropically decreased to be thinner than the post-oxide film 6b protected by the mask of the resist 22.

In the next step, the resist 22 within the element forming region 21b is removed, followed by diffusing an impurity into the surface region of the silicon substrate 1 within the element forming region 21a by the ion implantation of, for example, phosphorus, thereby forming $n^-$-type low concentration impurity diffusion layers 9a and 9c. In performing the impurity diffusion, the gate electrode 5a performs the function of the mask. It follows that the impurity is diffused in a self-aligned fashion with the gate electrode 5a, with the result that the impurity diffusion layers 9a and 9c are formed in a manner to extend from directly under the side wall of the gate electrode 5a into regions below the gate electrode 5a. Incidentally, an impurity is similarly diffused into the surface region of the silicon substrate 1 in the element forming region 21b by the ion implantation of, for example, boron so as to form $p^-$-type low concentration impurity diffusion layers 9b, 9d.

Figure 4A:
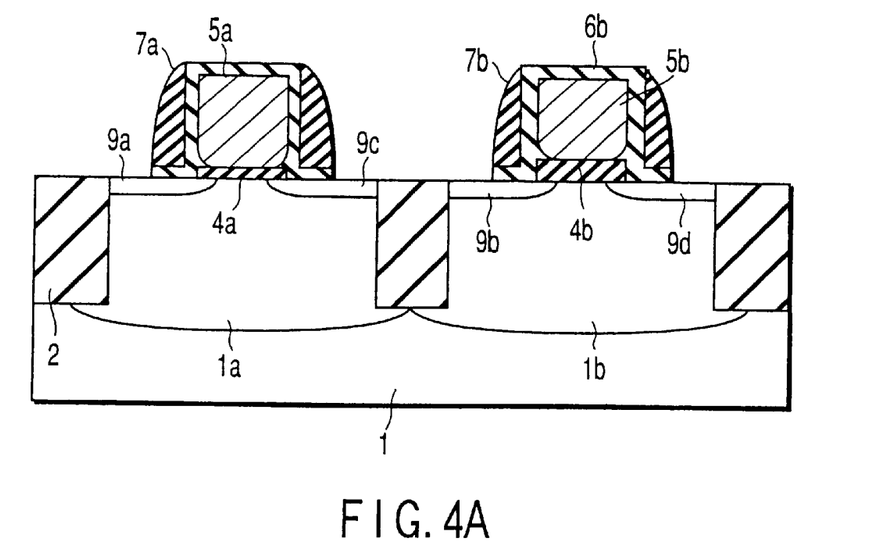
FIGS. 4A and 4B are cross-sectional views collectively showing the steps following the manufacturing step shown in FIG. 3B.

Then, an insulating film made of $SiO_2$ is deposited on the entire surface of the semiconductor device by a CVD (Chemical Vapor Deposition) method, followed by removing the insulating film by, for example, an anisotropic etching so as to form side wall insulating films 7a, 7b on the side walls of the gate electrodes 5a, 5b, as shown in FIG. 4A. By this anisotropic etching, the post-oxide film 6a extending within the element forming region 21a to reach the element isolating insulating film 2 is selectively removed in a manner to allow that region of the post-oxide film 6a which covers a predetermined distance from the gate insulating film 4a and the gate electrode 5a to be left unremoved. By this selective removal of the post-oxide film 6a, the surface of the silicon substrate 1 having the impurity diffusion regions 9a, 9c formed therein is exposed to the outside in the region between the edge of the side wall insulating film 7a and the element isolating insulating film 2. Anisotropic etching is also applied to the element forming region 21b. It follows that the surface of the silicon substrate 1 having impurity diffusion layers 9b, 9d formed therein is exposed to the outside in the region between the edge of the side wall insulating film 7b and the element isolating insulating film 2.

Figure 4B:
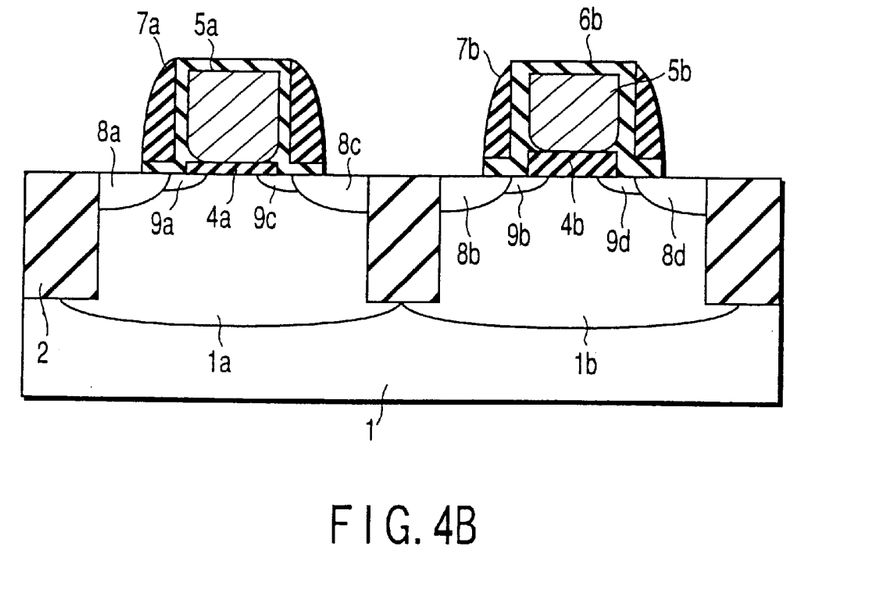

In the next step, an impurity is further diffused into the surface region of the silicon substrate 1 within the element forming region 21a so as to form $n^+$-type high concentration impurity layers 8a, 8c as shown in FIG. 4B. In this impurity diffusion step, the gate electrode 5a and the side wall insulating film 7a are used as a mask. It follows that the impurity is diffused in a manner to be self-aligned with the gate electrode 5a and the side wall insulating film 7a, with the result that the high concentration impurity diffusion layers 8a, 8c are formed in a manner to extend from directly under the edge of the side wall insulating film 7a into a region below the side wall insulating film 7a.

The low concentration diffusion layers 9a, 9c are formed by ion implantation of an impurity into the surface region of the silicon substrate 1 through the post-oxide film 9. However, the high concentration diffusion layers 8a, 8c are formed by directly diffusing an impurity into the exposed surface region of the silicon substrate 1, with the result that the high concentration diffusion layers 8a, 8c are formed deeper than the low concentration diffusion layers 9a, 9c.

It should also be noted that the low concentration diffusion layers 9a, 9c are formed to be aligned with the gate electrode 5a. On the other hand, the high concentration diffusion layers 8a, 8c are aligned with the side wall insulating film 7a in addition to the gate electrode 5a. It follows that the high concentration diffusion layers 8a, 8c do not extend to reach a region below the gate electrode 5a, though the low concentration diffusion layers 9a, 9c are formed to extend to reach a region below the gate electrode 5a. These diffusion layers 8a and 9a collectively form a source region, with the diffusion layers 8c and 9c collectively forming a drain region. Incidentally, the diffusion layers 8b, 8d and the diffusion layers 9b, 9d are equal in construction to the diffusion layers 8a, 8c and the diffusion layers 9a, 9c.

In the next step, in order to lower the wiring resistance, silicide films 10a, 10b are formed on the surfaces of the impurity diffusion layers 9a to 9d, and silicide layers 11a, 11b are formed on the upper surfaces of the gate electrodes 5a, 5b. The silicide films 10a, 10b, 11a, 11b are formed of, for example, $TiSi_2$, $CoSi_2$, PtSi, $Pd_2Si$, $IrSi_3$ or RhSi. For forming the silicide films 11a, 11b, the surfaces of the gate electrodes 5a, 5b are removed to a predetermined depth so as to form shallow trenches, followed by forming the silicide films 11a, 11b in these trenches. It follows that the silicide film 10a is formed in the exposed portion on the surface of the silicon substrate 1 within the element forming region 21a, and the silicide film 11a is formed in the exposed portion on the surface of the gate electrode 5a.

The silicide film 10a is formed contiguous to the diffusion layers 8a, 8b so as to form an elevated source-drain structure. In this fashion, manufactured is the semiconductor device including the MOSFETs 3a and 3b as shown in FIG. 1.

As described above, the post-oxide films 6a and 6b differing from each other in the thickness are formed to extend from the side wall of the gate electrode over the surface of the silicon substrate 1 in the first embodiment of the present invention described above. In other words, it is possible to form MOSFETs having the post-oxide films differing from each other in the thickness. It follows that it is possible for the various MOSFETs differing from each other in use to include post-oxide films having optimum thicknesses differing from each other so as to further facilitate the realization of an SOC or a system LSI. To be more specific, it is possible to use the MOSFET 3a having a thin post-oxide film 6a as a transistor for a logic circuit or an SRAM circuit. It is also possible to use the MOSFET 3b having a thick post-oxide film 6b as a transistor of, for example, a DRAM circuit or the analog circuit of a low power source voltage.

Also, in the first embodiment described above, one of the MOSFETs is subjected to a wet etching with the MOSFET covered with a mask consisting of, for example, a resist, making it possible to form the post-oxide films 6a, 6b differing from each other in thickness. Incidentally, a wet etching was employed in the first embodiment of the present invention. However, it is also possible to employ a dry etching.

If dry etching is employed, the etching proceeds anisotropically. As a result, that portion of the post-oxide film 6a which is positioned on the side of the side wall of the gate electrode 5a differs in thickness from that portion of the post-oxide film 6a which is positioned to face the surface of the silicon substrate 1. That portion of the post-oxide film 6a which is positioned along the side wall of the gate electrode 5a is etched only slightly, compared with wet etching. It follows that it is possible to form a MOSFET by slightly changing the thickness in each of those portions of the post-oxide 6a and the post-oxide film 6b which are positioned along the side wall portions of the gate electrodes 5a, 5b.

Second Embodiment:

A second embodiment is directed to a modification of the first embodiment. In the first embodiment, the post-oxide film 6a and the post-oxide film 6b were made different from each other in thickness by employing a half etching. On the other hand, the second embodiment is featured in that all the post-oxide film 6a is once removed by etching with the resist 22 formed selectively on only the MOSFET 3b, followed by newly forming the post-oxide film. It follows that the steps shown in FIGS. 2A to 3A in conjunction with the first embodiment are common with the second embodiment. To avoid an overlapping description, the steps after the step shown in FIG. 3A are shown in FIGS. 5A and 5B.

As shown in FIG. 3A, the resist 22 is deposited on the entire surface of the semiconductor device and, then, the resist 22 formed on the element forming region 21a is removed by a photolithography process so as to allow the resist 22 to remain only on the element forming region 21b, as in the first embodiment. Then, wet etching 23 using, for example, a dilute hydrofluoric acid is applied with the remaining resist 22 used as a mask so as to remove completely the post-oxide film 6a.

Figure 5A:
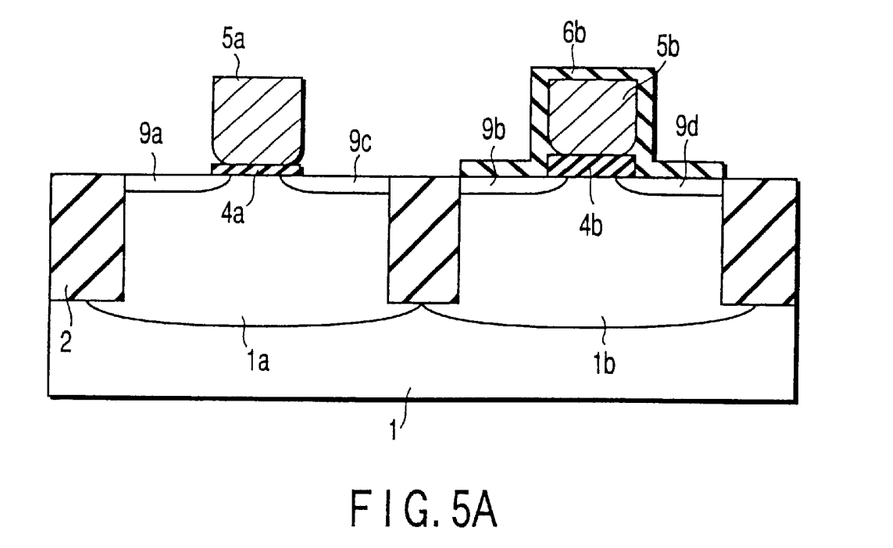
FIGS. 5A and 5B are cross-sectional views collectively showing the manufacturing process of a semiconductor device according to a second embodiment of the present invention.
Figure 5B:
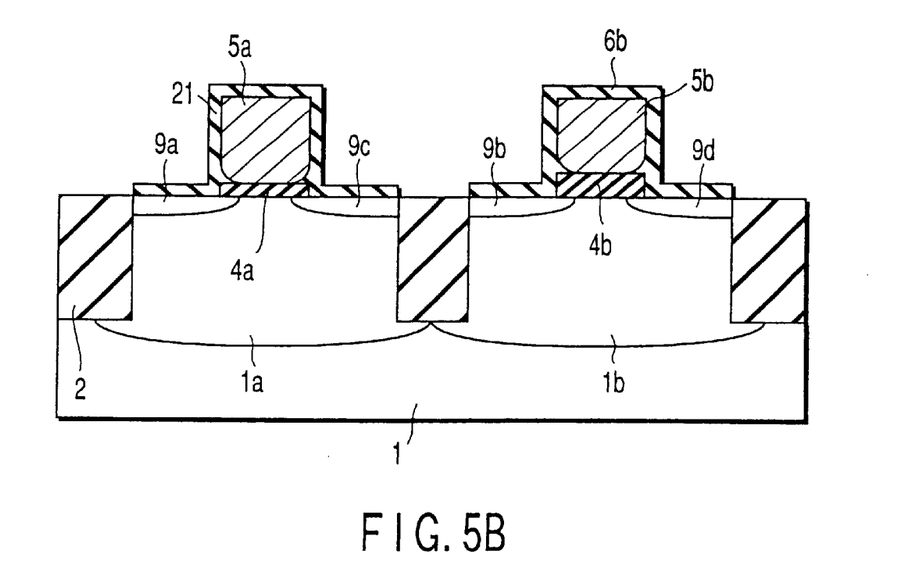

In the next step, the resist 22 on the element forming region 21b is removed as shown in FIG. 5A, followed by selectively forming a post-oxide film 21 on the MOSFET 3a, as shown in FIG. 5B. The post-oxide film 21 is formed under the conditions differing from those for forming the post-oxide films 6a and 6b. As a result, it is possible to form the post-oxide film 21 thinner than the post-oxide film 6b. Incidentally, the subsequent steps are equal to the steps shown in FIGS. 4A and 4B referred to previously in conjunction with the first embodiment.

According to the second embodiment of the present invention, a mask material, e.g., resist, is formed on only the first MOSFET, and the post-oxide film of the second MOSFET is completely removed with the resist used as the mask, followed by forming again a post-oxide film on the second MOSFET. It follows that it is possible to form, on the single silicon substrate 1, a plurality of MOSFETs including post-oxide films differing from each other in thickness as in the first embodiment of the present invention.

In the second embodiment described above, the resist 22 was removed first, followed by newly forming the post-oxide film 21. Alternatively, it is also possible to newly form the post-oxide film 21 with the resist 22 left unremoved. In this case, it is possible to form the post-oxide film 21 with the resist 22 used as a mask, making it possible to easily form the post-oxide film 21 differing in the thickness from the post-oxide film 6b. It is also possible to form the post-oxide film 21 thicker than the post-oxide film 6b. In this case, it is desirable to form the gate insulating film 4b thinner than the gate insulating film 4a.

Third Embodiment:

A third embodiment is a modification of the first and second embodiments. In each of the first and second embodiments, the thickness of the post-oxide film in each of the MOSFETs 3a and 3b was changed by employing an etching. On the other hand, the third embodiment is characterized in that ion implantation is performed in advance into the post-oxide film-forming region before formation of the post-oxide film so as to promote the rate of oxidation. The step shown in FIG. 2A referred to previously in conjunction with the first embodiment is in common with the third embodiment. In order to avoid an overlapping description, the process after the step shown in FIG. 2A is shown in FIGS. 6A and 6B.

As shown in FIG. 2A, the gate insulating films 4a and 4b are formed in the element forming regions 21a and 21b, followed by forming the gate electrodes 5a and 5b on the gate insulating films 4a and 4b, respectively.

Figure 6A:
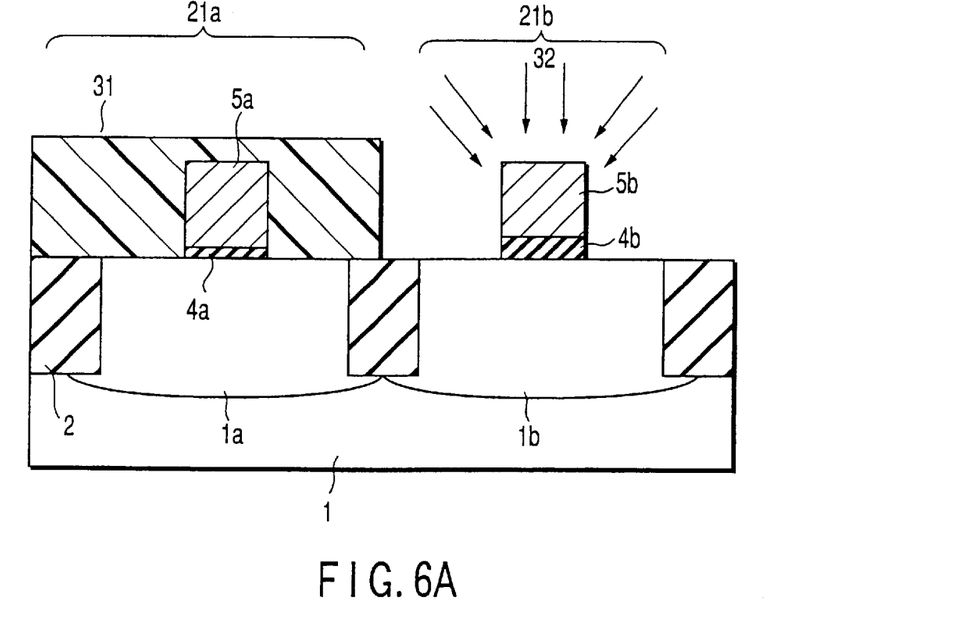
FIGS. 6A and 6B are cross-sectional views collectively showing the manufacturing process of a semiconductor device according to a third embodiment of the present invention.

In the next step, the entire surface of the semiconductor device is coated with a resist 31, followed by selectively removing the resist 31 formed on the MOSFET 3b and subsequently selectively forming the resist 31 on only the MOSFET 3a on which a thin post-oxide film is to be formed later, as shown in FIG. 6A. Then, ion implantation 32 is applied to the MOSFET 3b with the resist 31 used as a mask. The ions that permit promoting the rate of oxidation such as $Ar^+$, $Fe^+$ and $I^+$ are implanted into the MOSFET 3b.

Figure 6B:
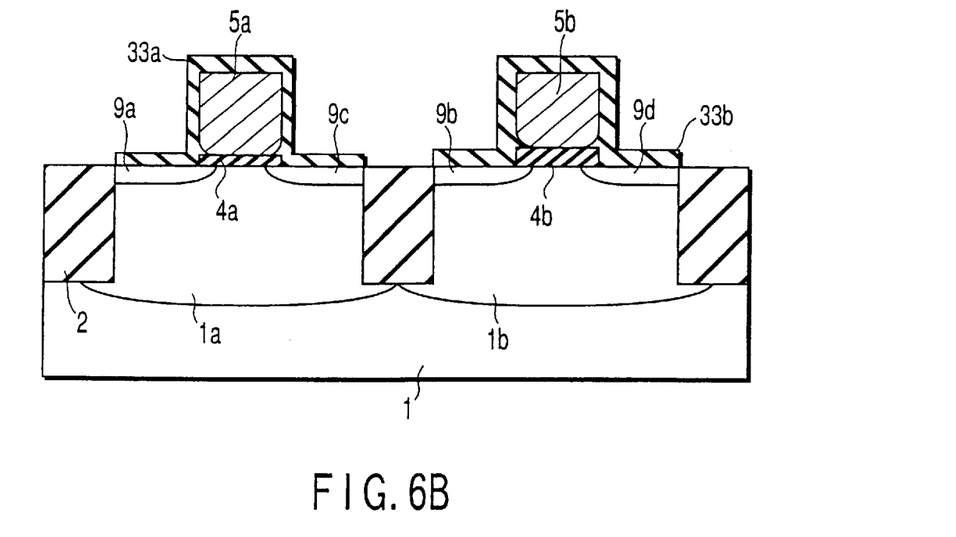

In the next step, the resist 31 is peeled off, followed by forming post-oxide films 33a and 33b on the MOSFETs 3a and 3b, respectively, as shown in FIG. 6B. Before the step of forming the post-oxide film 33b, the ions that permit promoting the rate of oxidation are already implanted into the MOSFET 3b in the step shown in FIG. 6A. It follows that the surface of the silicon substrate 1 and the side surface of the gate electrode 5b of the MOSFET 3b are oxidized at a rate higher than the oxidation rate of the MOSFET 3a, with the result that the post-oxide film 33b is rendered thicker than the post-oxide film 33a.

As described above, according to the third embodiment of the present invention, the construction similar to that of the first embodiment can be formed solely by ion implantation, without having to perform etching.

Fourth Embodiment:

A fourth embodiment is directed to a modification of the third embodiment. In the third embodiment, the post-oxide films differing from each other in thickness are formed by employing an ion implantation that permits promoting the rate of oxidation. On the other hand, the fourth embodiment is characterized in that the post-oxide films differing from each other in thickness are formed by employing ion implantation that permits lowering the rate of oxidation. As in the third embodiment, the step shown in FIG. 2A referred to previously in conjunction with the first embodiment is commonly employed in the fourth embodiment, too.

Figure 7A:
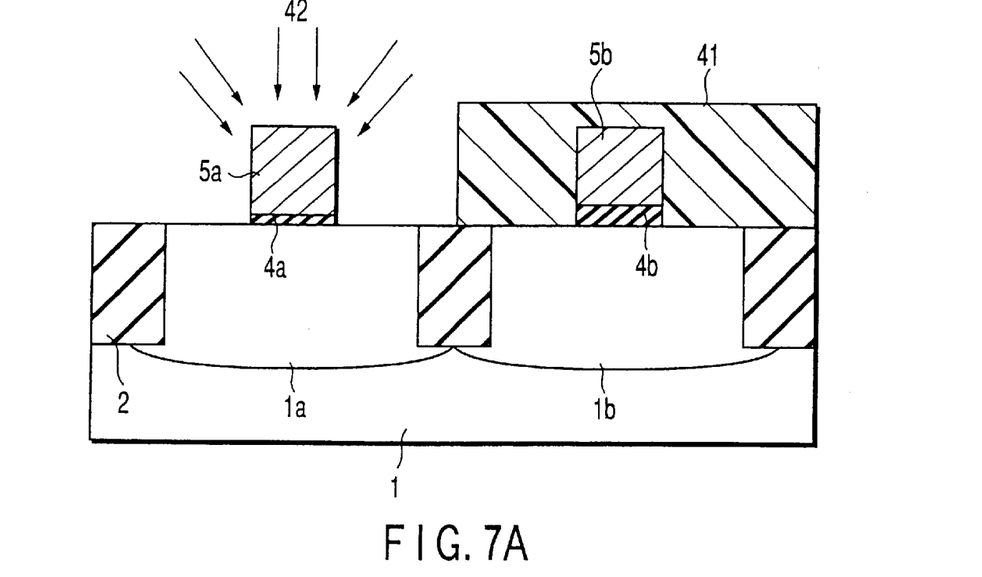
FIGS. 7A and 7B are cross-sectional views collectively showing the manufacturing process of a semiconductor device according to a fourth embodiment of the present invention.

In the fourth embodiment, after the step shown in FIG. 2A, a resist 41 is selectively formed in a manner to cover the MOSFET 3a alone as shown in FIG. 7A, which is opposite to the structure shown in FIG. 6A. Then, ion implantation 42 is performed with the resist 41 used as a mask. The ions that permit lowering the rate of oxidation such as $N^+$ are implanted into the MOSFET 3b.

Figure 7B:
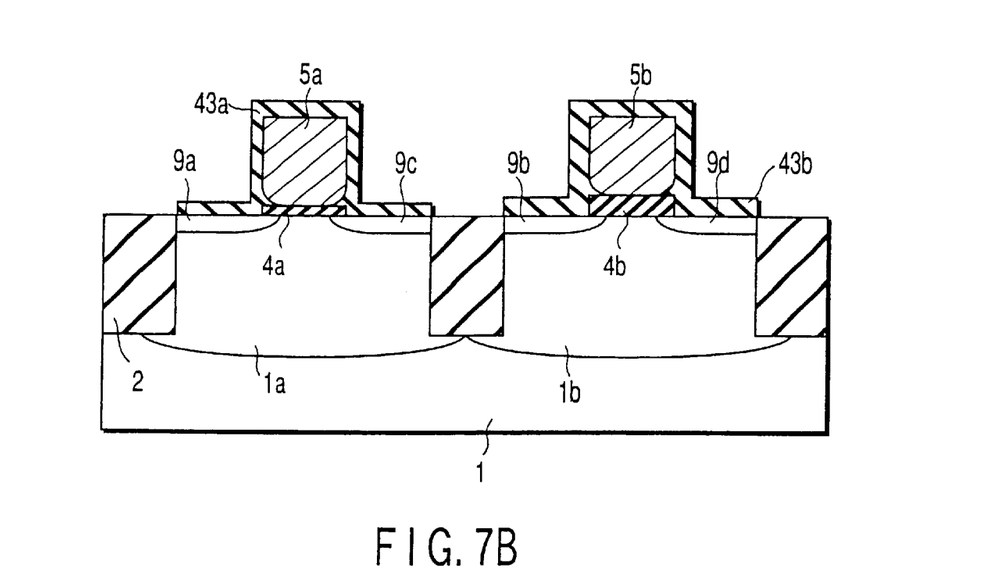

In the next step, the resist 41 is peeled off, followed by forming post-oxide films 43a and 43b on the MOSFETs 3a and 3b, respectively, as shown in FIG. 7B. Before the step of forming the post-oxide film 43b, the ions that permit lowering the rate of oxidation are already implanted into the MOSFET 3b in the step shown in FIG. 7A. It follows that the surface of the silicon substrate 1 and the side surface of the gate electrode 5b of the MOSFET 3a are oxidized at a rate lower than the oxidation rate of the MOSFET 3b, with the result that the post-oxide film 43b is rendered thicker than the post-oxide film 43a.

As described above, according to the fourth embodiment of the present invention, the construction similar to that of the first embodiment can be formed solely by ion implantation, without having to perform etching.

Fifth Embodiment:

In each of the first to fourth embodiments described above, the gate insulating films 4a, 4b and the gate electrodes 5a, 5b are formed by means of a lithography process, followed by forming the post-oxide film. In general, the patterns for processing the gates of various MOSFETs are simple ones for MOSFETs used in, for example, the DRAM section, and a complex pattern for processing the gate of the MOSFETs used in, for example, a logic section. As described above, where these MOSFETs are formed in a single chip, it is difficult to form the gate electrodes of these MOSFETs simultaneously by a lithography process. Such being the situation, employed is a method of forming the gates of these MOSFETs in different steps.

In a fifth embodiment of the present invention, the technical idea of the present invention is applied to the method referred to above. To be more specific, after the gate electrode of the first MOSFET is formed by lithography process, a post-oxide film is deposited on the entire surface of the semiconductor device, followed by forming the gate electrode of the second MOSFET by a lithography process. Then, a post-oxide film is formed on gate electrode of the second MOSFET.

Figure 8A:
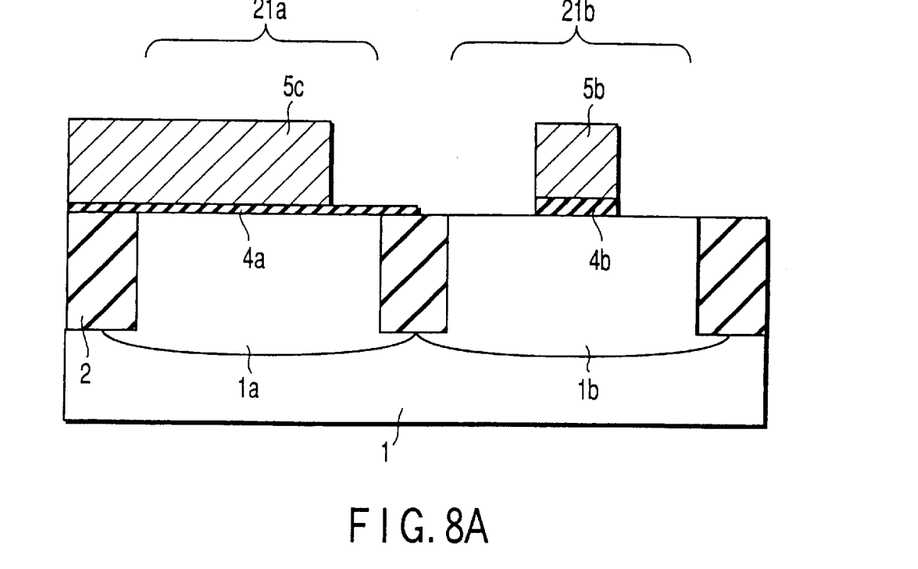
FIGS. 8A and 8B are cross-sectional views collectively showing the manufacturing process of a semiconductor device according to a fifth embodiment of the present invention.

As in the first embodiment, the element isolating insulating film 2, the p-type well 1a, and the n-type well 1b are formed on the surface of the silicon substrate 1. Then, the gate insulating film 4a is formed within the element forming region 21a, and the gate insulating film 4b is formed within the element forming region 21b, as shown in FIG. 8A. Further, an electrode material film 5c is deposited on the entire surface of the semiconductor device, followed by processing the electrode material film 5c of the MOSFET 3b alone by lithography, to form the gate electrode 5b.

Figure 8B:
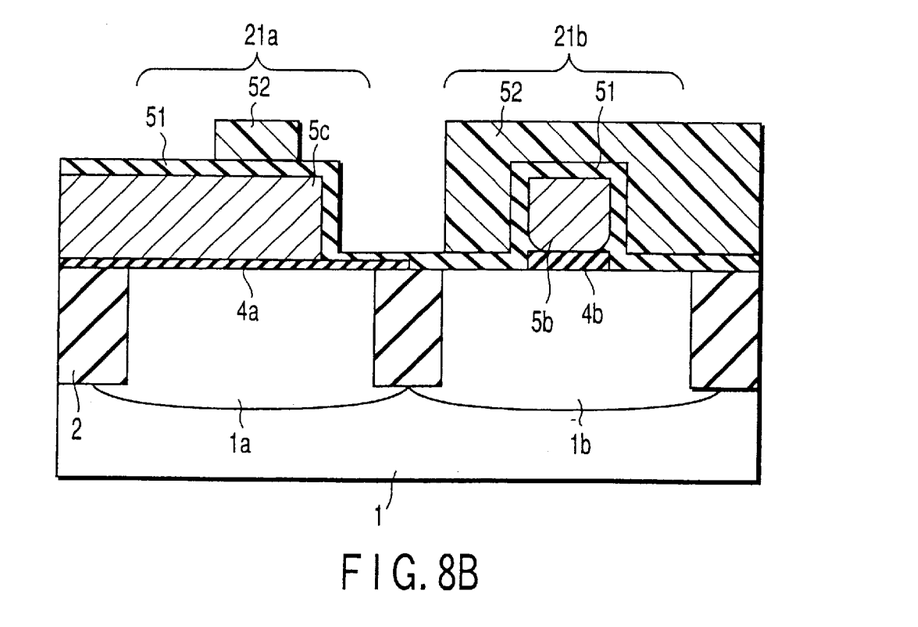

In the next step, a post-oxide film 51 is formed on the entire surface of the semiconductor device. Then, after a resist 52 is deposited on the entire surface of the semiconductor device, the resist 52 is allowed to remain only within the semiconductor forming region 21b, and on that region within the element forming region 21a on which the gate electrode 5a is to be formed, as shown in FIG. 8B.

Figure 9A:
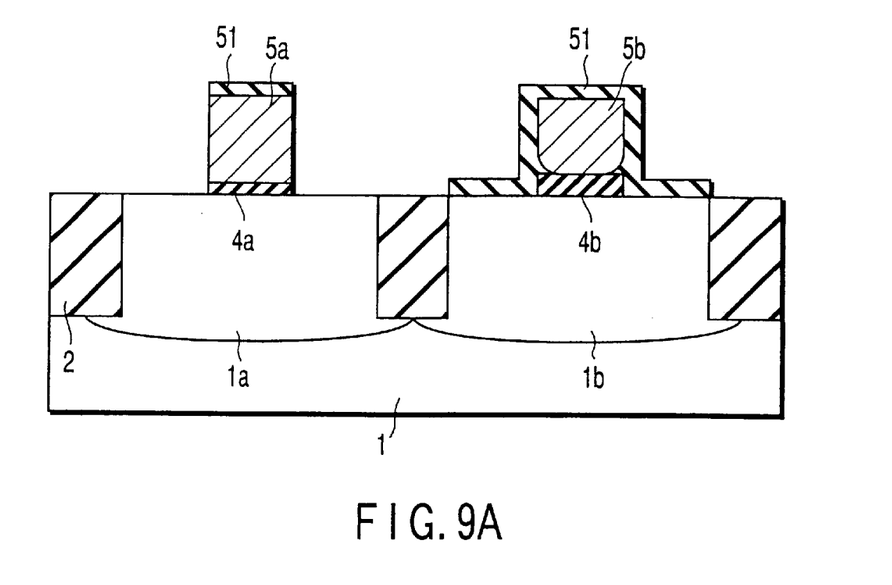
FIGS. 9A and 9B are cross-sectional views showing the manufacturing steps following the step shown in FIG. 8.

In the next step, the gate electrode 5a and the gate insulating film 4a of the MOSFET 3a are processed by etching with the resist 52 used as a mask, as shown in FIG. 9A. By this etching, the gate insulating film 4a, the electrode material film 5c and the post-oxide film 51 are completely removed in the region other than the region in which the gate electrode 5a is formed on the surface of the silicon substrate 1 within the element forming region 21a. Then, the remaining resist 52 is removed.

Figure 9B:
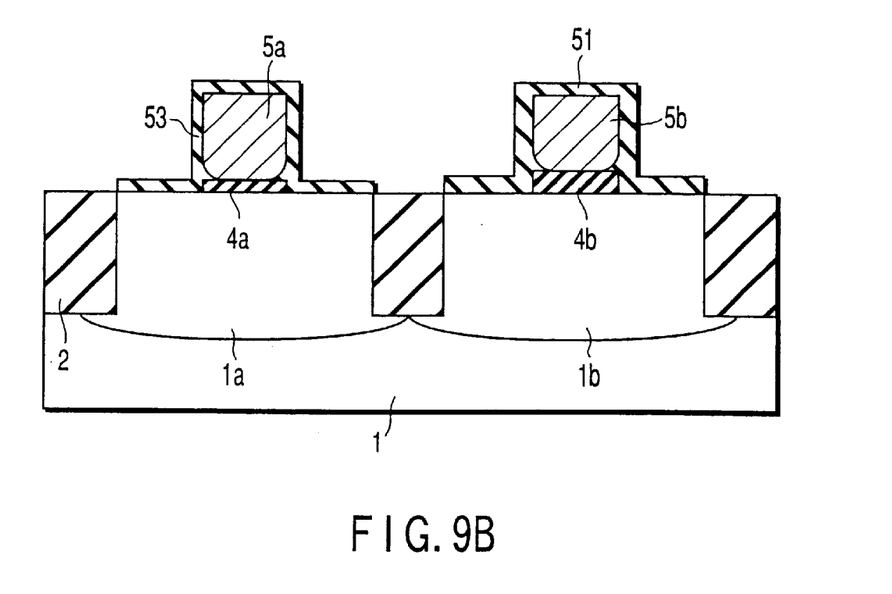

In the next step, a post-oxide film 53 is selectively formed on the MOSFET 3a alone, as shown in FIG. 9B. The subsequent steps are equal to those shown in FIGS. 4A and 4B referred to previously in conjunction with the first embodiment.

According to the fifth embodiment, the gate electrode of the first MOSFET is formed by a lithography process, followed by depositing a post-oxide film on the entire surface of the semiconductor device. Then, the gate electrode of the second MOSFET is formed by a lithography process, followed by forming a post-oxide film on the gate electrode of the second MOSFET. As a result, it is possible to form a plurality of MOSFETs including the post-oxide films differing from each other in thickness on a single silicon substrate 1 as in the first embodiment even in the case where the gates having different patterns are formed in different steps.

In the embodiment described above, wet etching using dilute hydrofluoric acid was employed to etch the post-oxide film. However, the etching of the post-oxide film is not limited to wet etching. Alternatively, it is also possible to employ wet etching using, for example, a dilute hydrofluoric acid or ammonium fluoride. It is also possible to employ dry etching using an organic gas.

Also, a silicide film was formed on the diffusion layer and the gate electrode in each of the embodiments described above. However, it is also possible to form a salicide film in place of the silicide film. Also, it is possible for the film formed on the gate electrode to be of a laminate structure including a metal film. Further, where it is unnecessary to lower the resistance of the wiring, these films need not be formed.

Each of the embodiments described above covers the case where two different MOSFETs are formed in a single chip for facilitating the description. In the case of manufacturing a semiconductor device including three MOSFETs having post-oxide films differing from each other in the thickness, two of the three MOSFETs are covered with the resist 22 used as a mask and the thickness of the post-oxide film of the remaining one MOSFET alone is decreased by etching 23 in the steps corresponding to the steps shown in FIGS. 3A and 3B. Then, the resist 22 covering one MOSFET is peeled off so as to decrease the thickness of the post-oxide film included in each of the remaining two MOSFETs, followed by peeling off the resist 22. As a result, it is possible to change the etching conditions so as to form three post-oxide films differing from each other in thickness. It is possible to form three post-oxide films differing from each other in thickness by a technology similar to that used in the steps shown in FIGS. 5A, 5B, 6A, 6B, 7A and 7B. Further, it is also possible to similarly form four or more post-oxide films differing from each other in thickness by changing the steps of forming the masks.

In each of the embodiments described above, the post-oxide film consists of an $SiO_2$ film, which was formed by oxidizing the gate electrodes 5a, 5b each consisting of, for example, polysilicon and the silicon substrate 1. However, the post-oxide film is not limited to the particular material and combination of the materials. For example, it is possible to use a nitride film such as $SiN_x$ or an oxynitride film such as $SiO_xN_y$ as a base material of the post-oxide film. Where the substrate and the gate electrode are formed of materials other than silicon, it is also possible to use other combinations. To be more specific, any material can be used as far as it is possible to form a film having a density higher than that of the side wall insulating film such as an $SiO_2$ film formed by a CVD method on the side wall of the post-oxide film. Also, the side wall insulating film is not limited to an $SiO_2$ film formed by the CVD method. It is possible for the side wall insulating film to be formed by another method. What should be noted is that any insulating film having a density higher than that of the side wall insulating film can be used for forming the post-oxide film. Incidentally, where the side wall insulating film is not formed, it suffices to use a film having a density higher than that of the interlayer insulating film surrounding the gate.

It is also possible to reverse the conductivity type employed in each of the embodiments described above.

Also, FIG. 3A shows the case where the thickness of the post-oxide film 6a is isotropically decreased by employing wet etching. If a dry etching is employed, however, it is possible to make that portion of the post-oxide film 6a which is positioned along the side surface of the gate electrode 5a thinner than the portion positioned on the surface of the substrate by utilizing the anisotropy of the etching. To be more specific, in the case of employing the etching having an anisotropy, it is possible to promote the etching on the side surface portion of the gate electrode 5a by making the angle in which the etching proceeds not perpendicular to the substrate surface. It is also possible to make the post-oxide film 6a on the substrate surface thinner than the post-oxide film 6a on the side surface of the gate electrode 5a by making the angle in which the etching proceeds perpendicular to the substrate surface.

The depth of the low concentration diffusion layers 9a, 9c is increased with the decrease in thickness of the post-oxide film 6a positioned on the substrate surface, and the electric field concentration in the vicinity of the side wall bottom portion 5f of the gate electrode is defined by both the thickness of the post-oxide film 6a on the surface of the substrate 1 and the thickness of the post-oxide film 6a on the side surface of the gate electrode 5a. In other words, the electric field concentration is increased with a decrease in the distance between the gate electrode 5a sandwiched between the post-oxide films 6a and the diffusion layer. It follows that it is possible to set the anisotropy of the etching with the required degree of suppressing the electric field concentration and the depth of the diffusion layer used as parameters.

Similarly, it is possible to control the directivity of ion implantation in the step shown in FIG. 6A. To be more specific, it is possible to perform ion implantation with the running angle of the ions relative to the substrate surface. Any running angle can be chosen as long as the direction allows the ions to be implanted to the side surface of the gate electrode 5b. By controlling the directivity of ion implantation in this fashion, it is possible to form post-oxide film 33b on the side surface of the gate electrode 5b in an amount larger than that on the surface of the substrate. On the contrary, it is also possible to control ion implantation such that the gate electrode 5b is formed in an amount smaller than that on the surface of the substrate in FIG. 7.

It should also be noted that, if the ions are implanted in an inclined direction, it is possible to implant ions over the entire region of the side wall of the gate electrode 5b and over the entire region of the side wall of the gate insulating film 4b. Therefore, the post-oxide film 33b is formed in a uniform thickness in the side walls of the gate electrode 5b and the gate insulating film 4b. Also, the gate electrode 5b and the gate insulating film 4b are formed columnar (not shown). Such being the situation, it is possible to perform ion implantation 32 not only from the side surface as shown in FIG. 6A but also from the front surface, the back surface and in an inclined fashion over all directions. In this case, it is possible to form the post-oxide film 33b having a uniform thickness on all the side surfaces of the gate electrode 5b and the gate insulating film 4b.

It is also possible to perform ion implantation in an inclined fashion over all directions in the step shown in FIG. 7A. As a result, it is possible to form the post-oxide film 43a having a uniform thickness over the entire side surfaces of the gate electrode 5a and the gate insulating film 4a.

Each of the embodiments described above is directed to a MOSFET using an insulating film consisting of $SiO_2$ as the gate insulating film 4a. However, the technical idea of the present invention can be applied to a MISFET having any type of the insulating film used therein.

Further, in each of the embodiments described above, the post-oxide film is formed to cover the gate insulating film, the gate electrode and the diffusion layer. However, the post-oxide film is not limited to the particular construction. It is possible for the is post-oxide film not to cover the upper surface of the gate electrode and not to cover that region of the diffusion layer which is positioned close to the element isolating insulating film, as long as the post-oxide film covers at least the gate electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including first and second MISFETs comprising the steps of:
   providing gate insulating films of said first and second MISFETs on a semiconductor substrate;
   providing gate electrodes on said gate insulating films;
   covering the gate electrodes of said first and second MISFETs with an insulating material film, said insulating material film providing the basis of a covering insulating film having a first region arranged on said semiconductor substrate and a second region arranged on the side surfaces of the gate electrode and the gate insulating film in said first and second MISFETs;
   decreasing the thickness of said insulating material film by etching in a region corresponding to said first region of said covering insulating film in said first MISFET, wherein said etching is applied to only said covering insulating film of said first MISFET; and
   forming after said etching step a source region and a drain region in the surface region of said semiconductor substrate by ion implantation through said first region of said covering insulating film with the gate electrode used as a mask in said first and second MISFETs.

2. The method of manufacturing a semiconductor device according to claim 1, wherein during said etching step, the covering insulating film of said second MISFET is covered with a resist mask.

3. The method of manufacturing a semiconductor device according to claim 1, further comprising the step of forming a CVD insulating film by a CVD method, said CVD insulating film covering the periphery of said covering insulating film.

4. A method of manufacturing a semiconductor device including first and second MISFETs comprising the steps of:
   providing gate insulating films of said first and second MISFETs on a semiconductor substrate;
   providing gate electrodes on said gate insulating films;
   implanting ions selected from the group consisting of ions that permit changing the oxidizing rate, ions that permit changing the nitriding rate and ions that permit changing the oxynitriding rate into regions in which said first MISFET is to be formed;

covering the gate electrodes of said first and second MISFETs with an insulating material film, said insulating material film providing the basis of a covering insulating film having a first region arranged on said semiconductor substrate and a second region arranged on the side surfaces of the gate electrode and the gate insulating film in said first and second MISFETs; and forming, after the gate electrodes of said first and second MISFETs are covered with said insulating material film, a source region and a drain region in the surface region of said semiconductor substrate by ion implantation through said first region of said covering insulating film with the gate electrode used as a mask in said first and second MISFETs;

wherein, in the case of implanting ions that permit changing the oxidizing rate, said covering insulating film is a semiconductor oxide film; in the case of implanting ions that permit changing the nitriding rate, said covering insulating film is a semiconductor nitride film; and in the case of implanting ions that permit changing the oxynitriding rate, said covering insulating film is a semiconductor oxynitride film.

5. The method of manufacturing a semiconductor device according to claim 4, further comprising the step of forming a CVD insulating film by a CVD method, said CVD insulating film covering the periphery of said covering insulating film.

6. The method of manufacturing a semiconductor device according to claim 4, wherein said ion implantation is performed by inclining the running direction of the ions relative to said semiconductor substrate so as to allow said covering insulating film of said first MISFET to have said first region and said region differing from each other in thickness.

7. The method of manufacturing a semiconductor device according to claim 4, wherein said ion implantation is performed by inclining the running direction of the ions relative to said semiconductor substrate so as to allow said covering insulating film of said first MISFET to have said second region having a uniform thickness.

8. The method of manufacturing a semiconductor device according to claim 4, wherein said ion implantation is performed from all directions of the side surface of said gate electrode of said first MISFET so as to allow said covering insulating film of the first MISFET to have said second region having a uniform thickness in every direction.

9. A method of manufacturing a semiconductor device including first and second MISFETs comprising the steps of:

providing gate insulating films of said first and second MISFETs on a semiconductor substrate;

providing an electrode material film providing the basis of a gate electrode on said gate insulating films;

etching said electrode material film in said first MISFET so as to form said gate electrode;

covering, after said etching step, the gate electrode in said first MISFET and said electrode material film in said second MISFET with a first insulating material film, said first insulating material film providing the basis of a covering insulating film having a first region arranged on said semiconductor substrate and a second region arranged on the side surfaces of the gate electrode and the gate insulating film in said first MISFET;

etching said first insulating film and said electrode material film in said second MISFET so as to form said gate electrode;

removing the first insulating material film in said second MISFET after said etching step;

covering the gate electrode with a second insulating material film in said second MISFET after removal of said first insulating material film, said second insulating material film providing the basis of a covering insulating film having a first region arranged on said semiconductor substrate and second region arranged on the side surfaces of the gate electrode and the gate insulating film in said second MISFET; and forming, after the gate electrode of said second MISFET is covered with said second insulating material film, a source region and a drain region in the surface region of said semiconductor substrate by ion implantation through said first region of said covering insulating film with the gate electrode used as a mask in said first and second MISFETs.

10. The method of manufacturing a semiconductor device according to claim 9, further comprising the step of forming a CVD insulating film by a CVD method, said CVD insulating film covering the periphery of said covering insulating film.

11. The method of manufacturing a semiconductor device according to claim 1, wherein:

said providing said gate insulating films includes providing, onto said semiconductor substrate, second material films which serve as said gate insulating films;

said providing said gate electrodes includes providing third material films which serve as said gate electrodes, onto said second material films as said gate insulating films, and also includes patterning said third material films as said gate electrodes and said second material films as said gate insulating films, wherein parts of said second material films as said gate insulating films, which are located near said third material films as said gate electrodes which serve as gate electrodes of said first and second MISFETs, are removed during said patterning.

12. The method of manufacturing a semiconductor device according to claim 3, further comprising forming a diffusion region by implanting ions into said semiconductor substrate with said CVD insulating film used as a mask, said diffusion region being in contact with said source and drain regions and reaching a portion of said semiconductor substrate deeper than said source and drain regions.

* * * * *